United States Patent
Yoon et al.

(10) Patent No.: US 9,236,295 B2
(45) Date of Patent: Jan. 12, 2016

(54) SEMICONDUCTOR CHIP, SEMICONDUCTOR APPARATUS HAVING THE SAME AND METHOD OF ARRANGING THE SAME

(71) Applicant: SK hynix Inc., Icheon-si, Gyeonggi-do (KR)

(72) Inventors: Young Hee Yoon, Icheon-si (KR); Kang Seol Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/013,932

(22) Filed: Aug. 29, 2013

(65) Prior Publication Data

US 2014/0353664 A1 Dec. 4, 2014

(30) Foreign Application Priority Data

May 28, 2013 (KR) ........................ 10-2013-0060142

(51) Int. Cl.
*G01R 31/26* (2014.01)
*G01R 1/06* (2006.01)
*H01L 21/768* (2006.01)
*G11C 5/02* (2006.01)
*G11C 5/06* (2006.01)
*H01L 21/66* (2006.01)
*H01L 23/48* (2006.01)
*G11C 5/04* (2006.01)
*G11C 8/12* (2006.01)
*H01L 23/00* (2006.01)
*H01L 25/065* (2006.01)

(52) U.S. Cl.
CPC .......... *H01L 21/76877* (2013.01); *G11C 5/025* (2013.01); *G11C 5/063* (2013.01); *H01L 22/32* (2013.01); *H01L 23/481* (2013.01); *G11C 5/04* (2013.01); *G11C 8/12* (2013.01); *H01L 24/06* (2013.01); *H01L 24/16* (2013.01); *H01L 25/0657* (2013.01); *H01L 2224/0401* (2013.01); *H01L 2224/06136* (2013.01); *H01L 2224/16145* (2013.01); *H01L 2224/16225* (2013.01); *H01L 2225/06513* (2013.01); *H01L 2225/06517* (2013.01); *H01L 2225/06544* (2013.01)

(58) Field of Classification Search
CPC ........ G01R 31/26; G01R 31/28; G01R 31/30; G01R 31/31
USPC .......... 257/48–57, 773–777, E21.521; 438/4, 438/11–18; 324/754, 762; 365/189.17
See application file for complete search history.

(56) References Cited

U.S. PATENT DOCUMENTS

| 2009/0278251 | A1 | 11/2009 | Tsai et al. | |
| 2010/0020583 | A1* | 1/2010 | Kang et al. | 365/51 |
| 2011/0156736 | A1* | 6/2011 | Yun et al. | 324/754.03 |
| 2012/0105093 | A1* | 5/2012 | Lee | 324/762.01 |

* cited by examiner

*Primary Examiner* — Evan Pert
*Assistant Examiner* — Changhyun Yi
(74) *Attorney, Agent, or Firm* — William Park & Associates Ltd.

(57) ABSTRACT

Provided is a semiconductor apparatus in which a plurality of semiconductor chips stacked in a vertical direction. Each of the semiconductor chips comprises: a bank area comprising a plurality of banks configured to store data; and a peripheral area including a pad area in which a plurality of pads configured to receive signals for controlling the bank area and a plurality of TSV for electrically connecting the plurality of pads, respectively.

19 Claims, 4 Drawing Sheets

US 9,236,295 B2

SEMICONDUCTOR CHIP, SEMICONDUCTOR APPARATUS HAVING THE SAME AND METHOD OF ARRANGING THE SAME

CROSS-REFERENCES TO RELATED APPLICATION

The present application claims priority under 35 U.S.C. §119(a) to Korean application number 10-2013-0060142, filed on May 28, 2013, in the Korean Intellectual Property Office, which is incorporated herein by reference in its entirety.

BACKGROUND

1. Technical Field

Various embodiments relate to a semiconductor apparatus, and more particularly, to a semiconductor apparatus including a plurality of semiconductor chips stacked therein.

2. Related Art

As semiconductor products are highly integrated, a structure including a plurality of semiconductor chips stacked three-dimensionally therein, that is, a stack package has been proposed.

The plurality of semiconductor chips included in the stack package may be electrically connected using a interconnecting member such as a wire which connects between each chip and a package board. The stack package may decrease a fabricating cost, have various performances and be mass-produced. However, with the increase in the number of stacked semiconductor chips, an interconnection space for electrical connection in the stack package is reduced and a height of the stack package increase.

As an example of a stack package considering such a disadvantage, a structure using a through-silicon via (TSV) has been proposed.

The TSVs are formed in each of the semiconductor chips. The TSVs are formed to penetrate the each of the semiconductor chips. The one or more semiconductor chips are physically and electrically stacked and coupled through a connection between TSVs.

Referring to FIG. 1, the first semiconductor chip of the conventional stack package includes a bank unit 110, a TSV insertion unit 120, a pad unit 130, and a TSV control unit 140. The bank unit 110 includes a plurality of banks BANK0 to BANK7 for storing data. The TSV insertion unit 120 includes a plurality of TSVs. For stacking the chips, a TSV of a first semiconductor chip (not shown) is physically and electrically coupled to that of a second semiconductor chip (not shown). The pad unit 130 includes a plurality of power pads 131, a plurality of signal pads 132, and a plurality of probe pad 133 which are alternately arranged. The TSV control unit 140 is configured to control the TSV formed through the TSV insertion unit 120.

As known well, a selected TSV of the first semiconductor chip has to be electrically connected with a selected pad of the pad unit 130 which are formed in the first semiconductor chip. Since the TSV insertion unit 120 is arranged between the bank unit 110 and the pad unit 130 to occupy a predetermined area, the size of the semiconductor chip inevitably increases. Further, it needs a plurality of interconnection lines for connecting between the TSVs and the pads.

SUMMARY

In an embodiment, there is provided a semiconductor chip comprises: a bank unit including a plurality of banks configured to store data; a pad unit including a plurality of pads arranged therein, and configured to provide external signals to the bank unit and to arranged in a pad area; and a TSV insertion unit including one or more through-silicon via, wherein the TSV insertion unit is arranged in the pad area.

In an embodiment, there is provided a semiconductor apparatus in which a plurality of semiconductor chips stacked in a vertical direction. Each of the semiconductor chips comprises: a bank area comprising a plurality of banks configured to store data; and a peripheral area including a pad area in which a plurality of pads configured to receive signals for controlling the bank area and a plurality of TSV for electrically connecting the plurality of pads, respectively.

In an embodiment, a method of arranging a semiconductor chip comprises: defining a bank area and a peripheral area; dividing the peripheral area into a pad area to be arranged a plurality of pads and a peripheral circuit area; forming a plurality of pads in the pad area; and forming a plurality of TSVs in the TSV insertion unit area.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described below with reference to the accompanying drawings through exemplary embodiments. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

Figure 1:
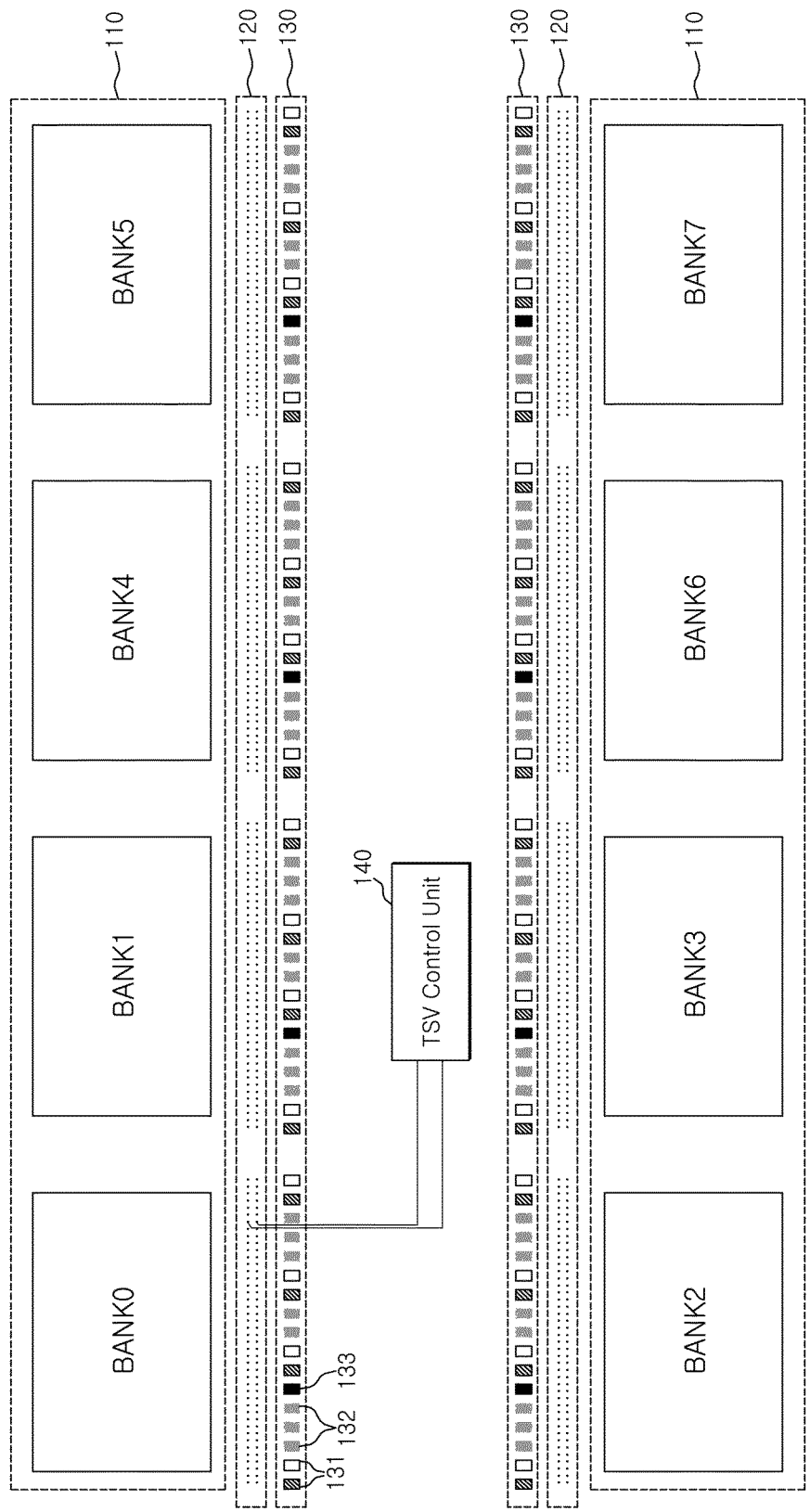
FIG. 1 is a configuration diagram illustrating a part of a first semiconductor chip of a conventional semiconductor apparatus.
Figure 2:
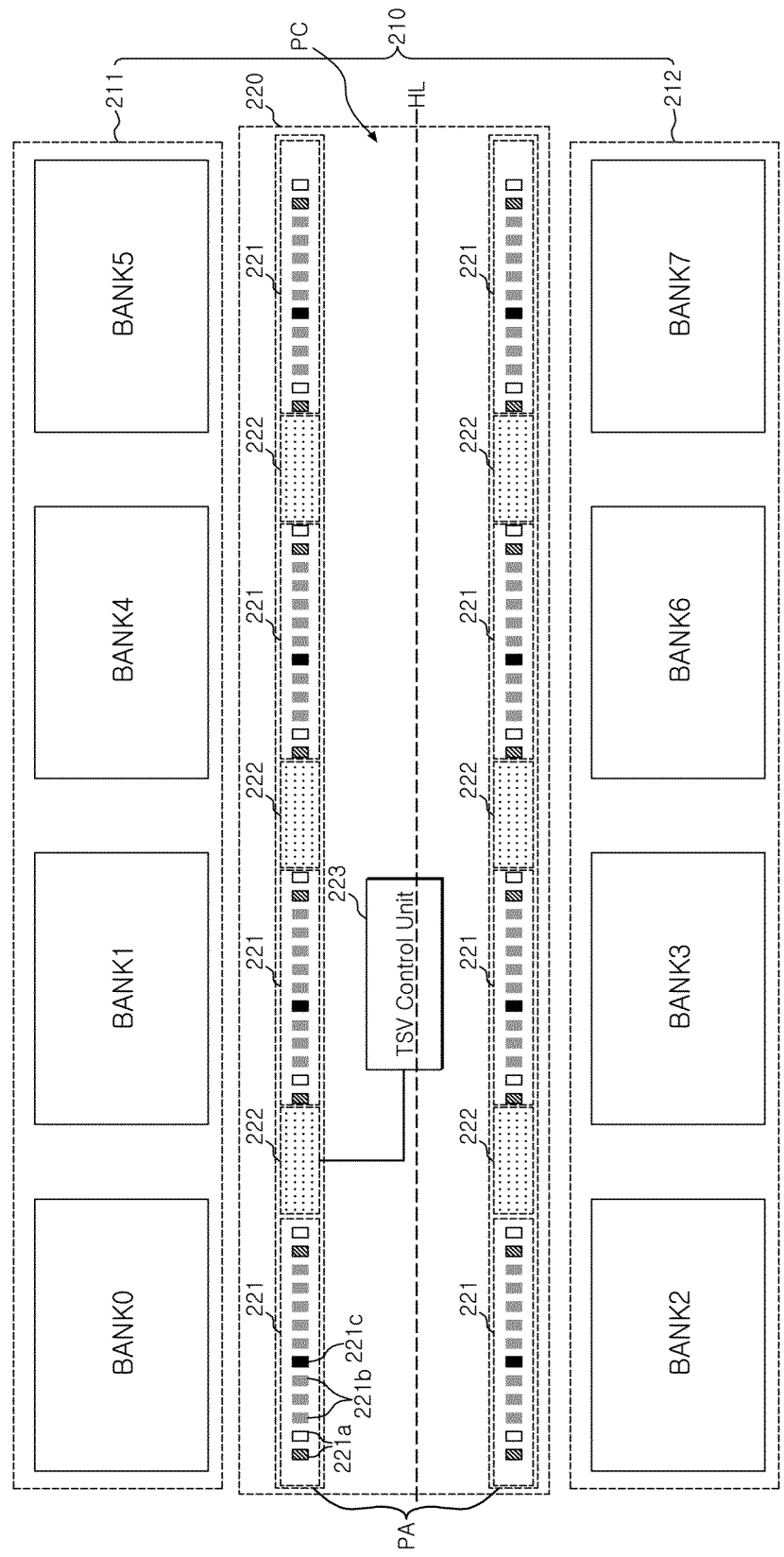
FIG. 2 is a configuration diagram illustrating a part of a first semiconductor chip of a semiconductor apparatus according to an embodiment of the present invention.

Referring to FIG. 2, the semiconductor apparatus, that is, a semiconductor stack package according to the embodiment of the present invention may have a structure in which one or more semiconductor chips are stacked. Among the one or more semiconductor chips, a first semiconductor chip 200 may include a bank area 210 and a peripheral area 220. The bank area 210 may include a plurality of banks BANK0 to BANK7 for storing data. The peripheral area 220 may include a peripheral circuit area PC to be formed a plurality of control circuits for controlling operations of the respective banks BANK0 to BANK7 l included in the bank area 210 and a pad area PA to be formed pads.

The bank area 210 may have a half bank structure which may be divided into an up bank 211 and a down bank 212 based on a half line HL of the first semiconductor chip 200 or the peripheral area 220. The up bank 211 and the down bank 212 may be spaced from each other with the peripheral area 220 provided there between.

The peripheral area 220 may include a pad unit 221, a TSV insertion unit 222, and a TSV control unit 223. The pad unit 221 may include a plurality of power pads 221a related to power of the first semiconductor chip 200, a plurality of signal pads 221b configured to receive an external signal, and a plurality of probe pads 221c configured to locally check whether a semiconductor chip has a defect or not. For example, the pad unit 221 may be arranged in the pad area PA. The TSV insertion unit 222 may include a plurality of TSVs. The TSVs may provide external signals to circuit devices which are integrated in the first semiconductor chip 200 through the pads. Further, the TSVs of the first semiconductor chip 200 may be connected to a second semiconductor chip (not shown) which is stacked on or under the first semiconductor chip, through an external connecting member, for example, bumps. For example, the TSV insertion unit 221 may be formed to correspond to the up bank 211 and the down bank 212, respectively.

The TSV control unit 223 may be configured to control a plurality of TSVs arranged in the TSV insertion units 222. Although not shown, the peripheral area 220 may further include a plurality of control circuits for controlling the operation of the bank area 210, for example, a decoding block.

The TSV insertion unit 222 may be arranged in the pad unit 221. That is, the TSV insertion unit 222 and the pad unit 221 may be arranged in the pad area PA. For example, the TSV insertion unit 222 and the pad unit 221 may be arranged to form a substantial a same line (or row).

As known well, the pad unit 221 may include a plurality of pads having a same function. In this embodiment, by removing a part of the plurality of pads having the same function, an area in which the TSV insertion unit 222 will be formed may be provided. For example, the removed pads may be the power pads 221a.

Figure 3:
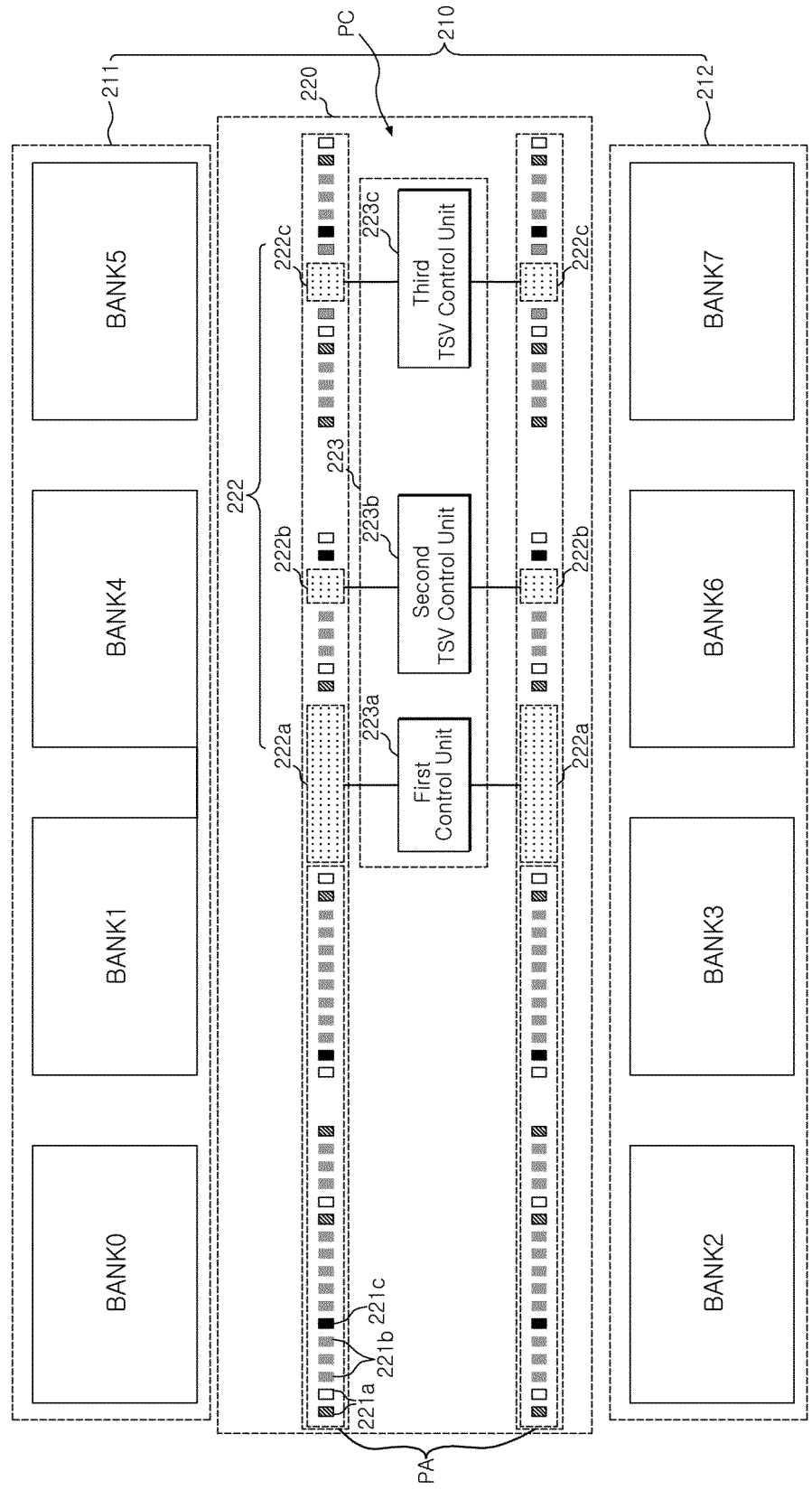
FIG. 3 is a configuration diagram illustrating a part of a first semiconductor chip of a semiconductor apparatus according to another embodiment of the present invention.

The position of the TSV insertion unit 222 may be changed depending on the position of the TSV control unit 223. Referring to FIG. 3, when the TSV control unit 223 may be disposed in a central area between the up bank 211 and the down bank 212, the TSV insertion unit 222 may be disposed at a position close to the TSV control unit 223, in order to reduce signal loading with the TSV control unit 223. For reference, FIG. 3 illustrates that the TSV insertion unit 222 corresponds to each of the up bank 211 and the down bank 212. However, the structure is not limited thereto, but the TSV insertion unit 222 may be selectively disposed nearby the up bank 211 or the down bank 212.

Referring to FIG. 3, the plurality of TSVs may be constituted of TSVs 222a receiving GIO signals and DQ signals (for example, signals or data loaded on global input/output lines), TSVs 222b receiving address clocks and TSVs 222c receiving command clocks. Thus, the TSVs 222 may be sorted and arranged by function types, that is, signals inputted to TSVs.

Further, the TSV control unit 223 may include a first TSV control unit 223a, a second TSV control unit 223b, and a third TSV control unit 223c. The first TSV control unit 223a may be configured to control the TSVs 222a receiving GIO signals and DQ signals. The second TSV control unit 223b may be configured to control the TSVs 222b receiving address clocks, and the third TSV control unit may be configured to control TSVs receiving the command clocks. The TSVs receiving the GIO signals and DQ signals may be disposed close to the first TSV control unit 223a. For example, the TSVs receiving the GIO signals and DQ signals may be disposed to face with the first TSV control unit 223a. The TSVs 222b receiving the address clocks may be disposed close to the second TSV control unit 223b. For example, the TSVs 222b receiving the address clocks may be disposed to face with the second TSV control unit 223b. The TSVs 222c receiving the command clocks may be disposed close to the third TSV control unit 223c. For example, the TSVs 222c receiving the address clocks may be disposed to face with the second TSV control unit 223b.

As the divided TSV control units 223 are arranged close to the TSVs sorted by the function types, signal characteristics, such as the signal loading is improved.

Figure 4:
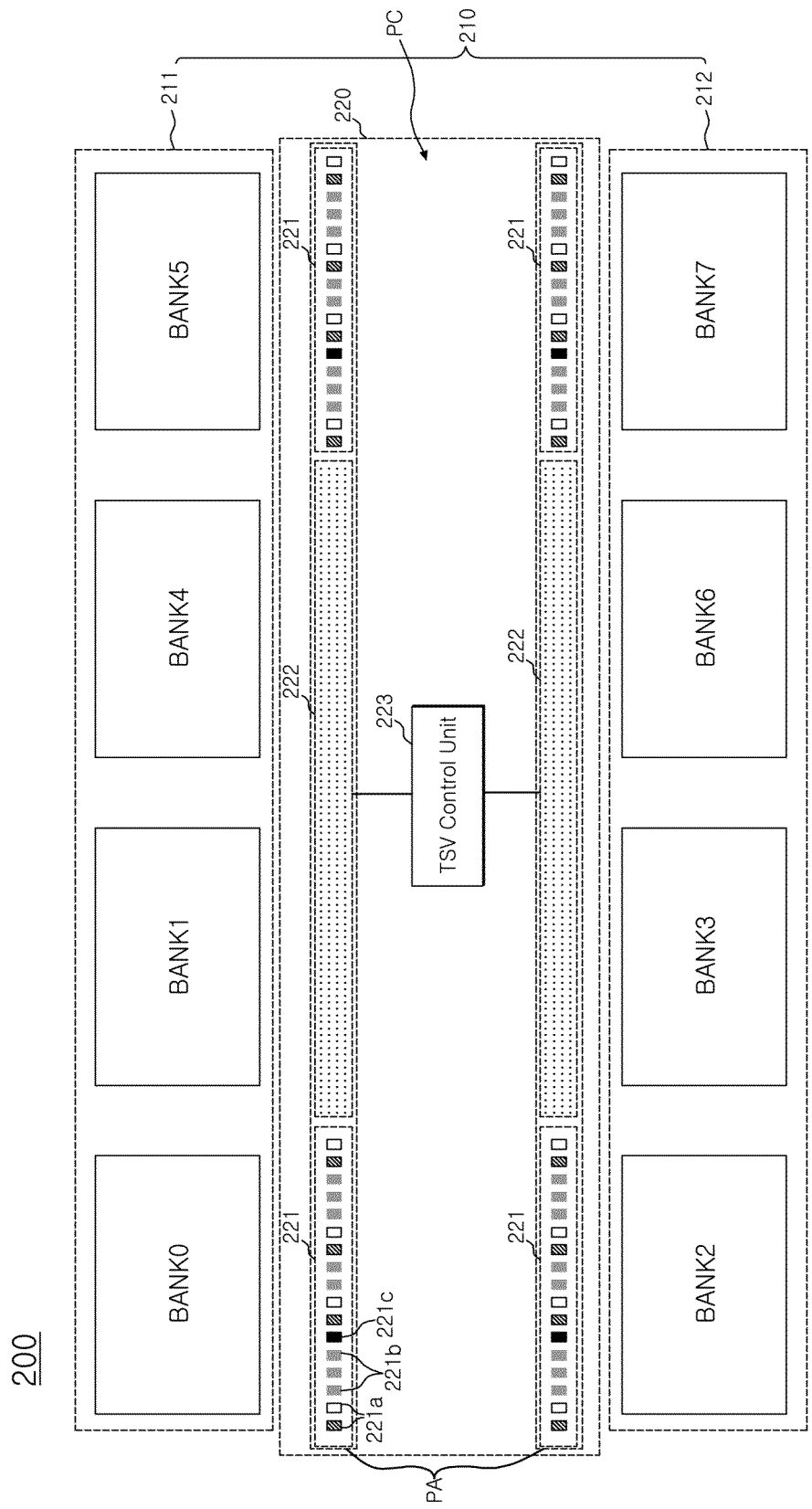
FIG. 4 is a configuration diagram illustrating a part of a first semiconductor chip of a semiconductor apparatus according to another embodiment of the present invention.

Referring to FIG. 4, the TSV insertion unit 222 may be arranged in a central part of the pad area PA and the TSV control unit may be arranged in a central part of the pad circuit area PC to face with the TSV insertion unit 222.

According to the above arrangement of the TSV insertion unit 222 and the TSV control unit 223, the distance between the TSV insertion unit 222 and the TSV control unit 223 in the peripheral area 220 may be reduced. Thus, signal loading and interference with another global signal may occur may be reduced. Further, it needs not an additional area for forming the TSV insertion unit since the TSV insertion unit is formed in the pad unit. Thus, an effective net die is improved.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor chip, comprises:
   a bank unit including a plurality of banks configured to store data, the plurality of banks including a first bank and a second bank;
   a pad unit including a plurality of pads, and configured to provide external signals to the bank unit and to be arranged in a pad area positioned between the banks; and
   a through-silicon via (TSV) insertion unit including a plurality of TSVs, wherein the TSV insertion unit is arranged in the pad area,
   wherein the plurality of pads and the plurality of TSVs are arranged in one line along a side of the bank unit, and at least a portion of the plurality of pads and the plurality of TSVs arranged in the line overlaps with a side of the first bank.

2. The semiconductor chip according to claim 1, further comprising a peripheral area including the pad area in which the pad unit and the TSV insertion unit are formed,
   wherein the bank unit is divided into an up bank and a down bank based on the peripheral area.

3. The semiconductor chip according to claim 1, wherein the pad unit includes:
   a plurality of power pads configured to receive power signals for operating the semiconductor chip;
   a plurality of signal pads configured to input and output data to the semiconductor chip; and
   a plurality of probe pads configured to check whether the semiconductor chip has a defect or not.

4. The semiconductor chip according to claim 1,
   wherein the pad unit includes a plurality of power pads, a plurality of signal pads, a plurality of probe pads and the TSV insertion unit and the pad unit are alternately arranged.

5. The semiconductor chip according to claim 4, wherein the TSVs of the TSV insertion unit are classified into a plurality of sub TSV insertion units according to their functions, and the plurality of sub TSV insertion units are arranged to be separated into one another.

6. The semiconductor chip according to claim 4, wherein the TSV insertion unit is arranged at a central part of the pad unit.

7. The semiconductor chip according to claim 4, wherein the TSV insertion unit includes:

a first TSV insertion unit configured to receive and transmit input/output signals and data;

a second TSV insertion unit configured to receive and transmit address signals; and a third TSV insertion unit configured to receive and transmit command and clock, wherein the first to third TSV insertion units are arranged to be separated into one another.

8. The semiconductor chip according to claim 7, further comprising a TSV control unit configured to control the first to third TSV insertion units.

9. The semiconductor chip according to claim 8, wherein the TSV control unit includes:

a first control unit for controlling the first TSV insertion unit, configured to be arranged to face with the first TSV insertion unit;

a second control unit for controlling the second TSV insertion unit, configured to be arranged to face with the second TSV insertion unit; and a third control unit for controlling the third TSV insertion unit, configured to be arranged to face with the third TSV insertion unit.

10. The semiconductor chip according to claim 1, wherein the plurality of pads and the plurality of TSVs are arranged in the line in an interleaved manner along the side of the bank unit.

11. A semiconductor apparatus in which a plurality of semiconductor chips stacked in a vertical direction, wherein each of the semiconductor chips comprises:

a bank area comprising a plurality of banks configured to store data; and a peripheral area including a pad area in which a plurality of pads configured to receive signals for controlling the bank area and a plurality of TSVs for electrically connecting the plurality of pads, respectively, wherein the plurality of pads and the plurality of TSVs are arranged in one line along a side of the bank area, and wherein a selected TSV of a selected chip is electrically connected to TSVs of an upper chip or a lower chip of the selected chip.

12. The semiconductor apparatus according to claim 11, wherein the bank area comprises:

an up bank unit including one or more banks arranged at one side based on the peripheral area; and a down bank unit including one or more banks arranged at the other side based on the peripheral area.

13. The semiconductor apparatus according to claim 12, wherein the peripheral area comprises:

a pad unit including a plurality of pads, arranged in the pad area; and a TSV control unit configured to control the plurality of TSVs, wherein the TSV insertion unit is formed in the pad unit.

14. The semiconductor apparatus according to claim 13, wherein the TSV insertion unit is arranged between the pads in the pad unit.

15. The semiconductor apparatus according to claim 13, wherein the TSV insertion unit includes a plurality of sub TSV insertion units.

16. The semiconductor apparatus according to claim 13, wherein the pads and the plurality of sub TSV insertion units are alternately arranged.

17. The semiconductor chip according to claim 13, wherein the TSV insertion unit includes:

a first TSV insertion unit configured to receive and transmit input/output signals and data;

a second TSV insertion unit configured to receive and transmit address signals; and a third TSV insertion unit configured to receive and transmit command and clock, wherein the first to third TSV insertion units are arranged to be separated one another.

18. The semiconductor chip according to claim 15, wherein the TSV control unit includes:

a first control unit for controlling the first TSV insertion unit, configured to be arranged to face with the first TSV insertion unit;

a second control unit for controlling the second TSV insertion unit, configured to be arranged to face with the second TSV insertion unit; and a third control unit for controlling the third TSV insertion unit, configured to be arranged to face with the third TSV insertion unit.

19. The semiconductor apparatus according to claim 11, wherein the TSV insertion unit is arranged in a central part of the pad area.

* * * * *